(12) United States Patent
Morzano

(10) Patent No.: US 6,385,108 B2
(45) Date of Patent: May 7, 2002

(54) VOLTAGE DIFFERENTIAL SENSING CIRCUIT AND METHODS OF USING SAME

(75) Inventor: Christopher K. Morzano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/738,420

(22) Filed: Dec. 15, 2000

Related U.S. Application Data

(62) Division of application No. 09/238,289, filed on Jan. 28, 1999, now Pat. No. 6,188,623.

(51) Int. Cl.⁷ .................................................. G11C 7/02
(52) U.S. Cl. ........................................ 365/207; 365/205
(58) Field of Search ................................ 365/205, 207, 365/208

(56) References Cited

U.S. PATENT DOCUMENTS

| | | |
|---|---|---|
| 4,962,326 A | 10/1990 | Parkinson et al. |
| 5,036,222 A | 7/1991 | Davis |
| 5,220,209 A | 6/1993 | Seymour |
| 5,325,330 A | 6/1994 | Morgan |
| 5,355,028 A | 10/1994 | O'Toole |
| 5,361,003 A | 11/1994 | Roberts |
| 5,367,207 A | 11/1994 | Powell |
| 5,457,654 A | 10/1995 | McLaury |
| 5,488,584 A | 1/1996 | Vo et al. |
| 5,500,817 A | 3/1996 | McLaury |
| 5,513,140 A | 4/1996 | Merritt |
| 5,946,256 A * | 8/1999 | Okimura ...................... 365/221 |
| 6,194,738 B1 * | 2/2001 | Debenham et al. ........... 365/96 |

* cited by examiner

*Primary Examiner*—Richard Elms
*Assistant Examiner*—VanThu Nguyen
(74) *Attorney, Agent, or Firm*—TraskBritt

(57) ABSTRACT

A voltage differential sensing circuit and methods of operation are disclosed for use in a memory device. The sensing circuit utilizes the inherent delay during sensing, i.e., the period between when an enable signal is enabled and when data is valid, by pulling a node of a transition logic circuit to a midpoint voltage. As the node of the transition logic circuit starts at a midpoint voltage, the voltage swing to valid data is faster because the output no longer needs to swing from rail to rail as before.

16 Claims, 7 Drawing Sheets

VOLTAGE DIFFERENTIAL SENSING CIRCUIT AND METHODS OF USING SAME

CROSS-REFERENCE TO RELATED APPLICATION

This is a divisional patent application of Ser. No. 09/238,289, filed Jan. 28, 1999, issued Feb. 13, 2001 as U.S. Pat. No. 6,188,623 B1.

FIELD OF THE INVENTION

The present invention relates generally to memory circuits and, more particularly, to a memory circuit utilizing a voltage differential sensing circuit that senses a data signal during a data output operation. More particularly still, the present invention relates to a voltage differential sensing circuit that reduces timing delay by holding a midpoint value before switching from a first state to a second state when outputting a data signal from the memory array.

BACKGROUND OF THE INVENTION

A conventional output buffer circuit transmits binary data signals of high and low potentials from an input node to an output node. The high and low potentials represent two states of the output buffer circuit.

These states constitute the unit of information typically stored and retrieved in digital systems, also known as a data bit. A data bit is a binary number having a value of 0 or 1. A data bit in a digital system has logic states of "high" and "low," often corresponding to a physical parameter such as the voltage at a node in a circuit. Information stored in semiconductor circuits is quantified in terms of the number of bits stored. These circuits, collectively called memory devices, include latches, flip-flops, and registers, depending to some extent on the number of bits stored. The memory cell is the fundamental circuit, however, for storing a data bit and is the building block from which latches, flip-flops, registers, and the like are made.

Several common circuits have been used for the memory cell in the various types of memory devices. Some devices, including the dynamic random access memory (DRAM), employ a memory cell circuit typically having one transistor. The DRAM cell provides one signal for storage data. Other devices, including the static random access memory (SRAM), employ a memory cell circuit having primarily a cross-coupled pair of transistors. The SRAM cell provides two complementary signals for storing data For example with complementary signals D and D*, a 0 is represented when D is low and D* is high; and a 1 is represented when D is high and D* is low. Other combinations of D and D* are undefined, and thus, serve no purpose in the memory device.

Memory devices that are used for storing many bits of information provide an output data signal in response to an input address signal during a "read" operation called a read cycle. In a complex memory device, the read operation may be performed as a process of selecting, sensing, and outputting the content of memory cells. The duration of such a process is called the access time. Complex memory devices may have several types of operations distinguished by control signals including read/write, address strobes, programming and errata strobes, transfer enable and output enable signals. The read cycle begins when the operation is defined by these control signals and an address is specified on the address input of the memory device.

The address can be specified in one of several ways, depending on the design of the memory device. For example, an address can be specified in serial, in conjunction with a clock signal, or in parallel, often accompanied by a strobe signal. A combination of these methods could be used, for example, by presenting on 16 parallel address lines a 32-bit address in two steps accompanied by upper and lower address strobes. In a conventional DRAM, these strobes are associated with the row and column organization of memory cells in an array. Designs for high density memory devices employ several arrays of cells having minute dimensions. Typically, the signal or signals representing the data bit in a memory cell in such an array are weak.

The read cycle concludes with the presentation of signals for use outside the memory device that represent the data addressed. The weak signal levels internal to the memory device are sensed and amplified. Amplified signals at internal signal levels are then translated to conventional logic levels and gated onto the output terminals of the memory device. The level translation and gating are accomplished by an output buffer circuit. When the output buffer circuit is supplying a signal on the output terminal, it is said to be gated on, or enabled; otherwise, it is off or disabled. One aspect important in the design of memory arrays is developing faster timing transitions between the inner action of the sensing circuit and the output buffer circuit.

One example where timing is an issue is in the use of voltage differential sensing circuits within a memory array. Typically, a voltage differential sensing circuit (hereinafter sensing circuit) is used to amplify an output signal from a memory array, but a transition from one potential to the other has to ripple through the sensing circuit as quickly as possible. Typically, the helper flip-flop must transition from a first potential to a second potential and a delay occurs because of such a transition in the worst case example.

Accordingly, what is needed is a method and apparatus that reduces the transitional delay from one potential to another within a sensing circuit when outputting a sensed signal in a memory device.

BRIEF SUMMARY OF THE INVENTION

According to the present invention, a sensing circuit is disclosed for use in a memory device. The sensing circuit utilizes the inherent delay between when the enable signal is enable and when data is valid by pulling the output gate of the sensing circuit to a midpoint voltage. As the output starts at a midpoint voltage, the voltage swing to valid data is faster because the output no longer needs to swing from a maximum voltage level to a minimum voltage level as before.

BRIEF DESCRIPTION OF THE DRAWINGS

In the drawings, which illustrate what is currently regarded as the best mode for carrying out the invention, and in which like reference numerals refer to like parts in different views or embodiments.

DETAILED DESCRIPTION OF THE INVENTION

Figure 1:
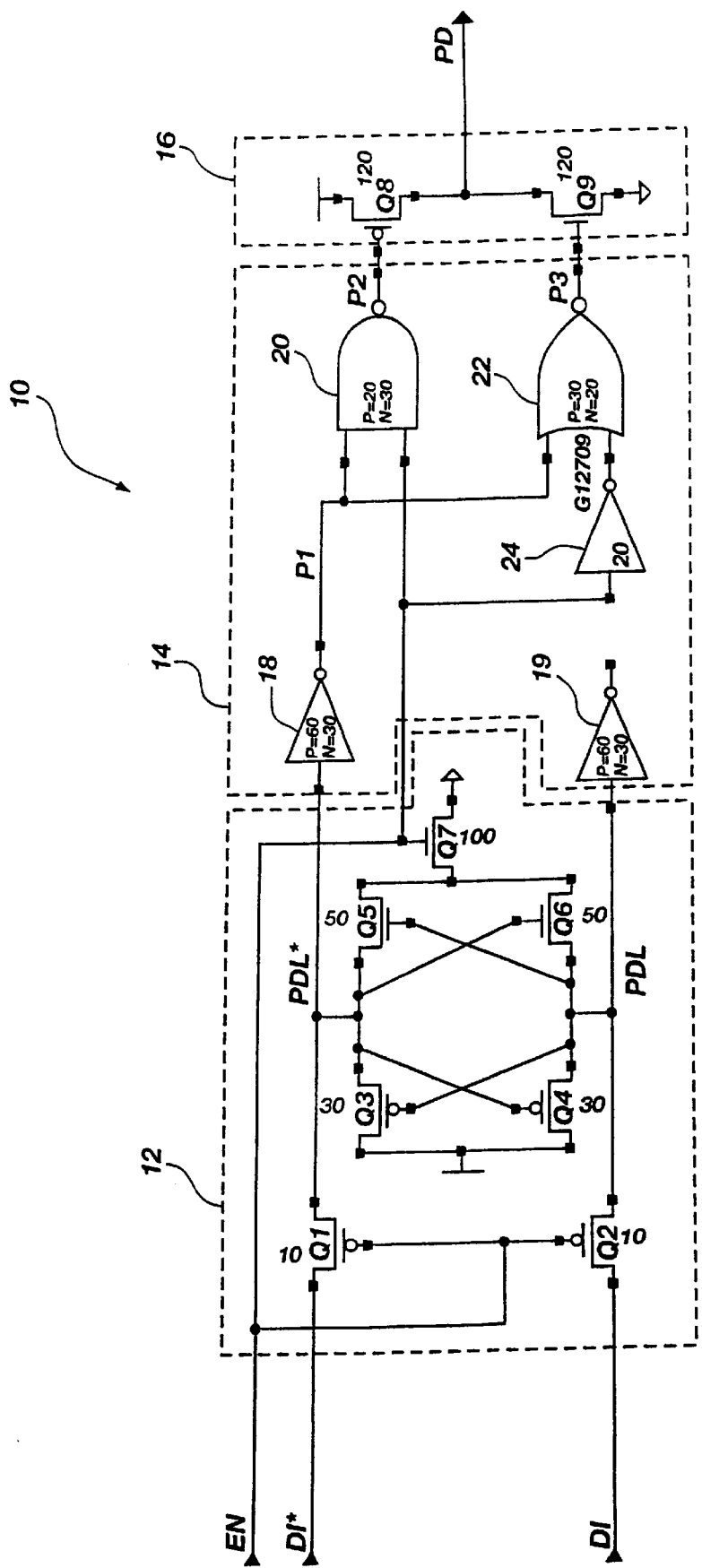
FIG. 1 is a schematic diagram of a sensing circuit according to the prior art.

FIG. 1 is a schematic diagram of a prior art sensing circuit 10 for use in a memory array (not shown). The sensing circuit 10 includes a standard helper flip-flop 12 coupled to a transition logic circuit 14 which in turn is coupled to an output driver circuit 16. Input signals to the sensing circuit 10 include an enable signal, EN, a data input line, DI, and a data input complement line, DI*. The output of the sensing circuit 10 is data output line PD. Throughout this detailed description when referring to the state of a signal line, a "high" is equivalent to a logical "1" and a "low" is equivalent to a logical "0". Similarly, "signal line", "line" and "signal" are all used synonymously throughout.

The helper flip-flop 12 is comprised of a plurality of field effect transistors, Q1–Q7, and its design is typically known to those skilled in the art. When the EN signal is low, transistors Q1 and Q2 conduct and the data input DI and data input complement DI* are connected with signal PDL and signal PDL*, respectively.

The transition logic circuit 14 in FIG. 1 includes a first inverter 18, a second inverter 19, a third inverter 24, a NAND gate 20 and a NOR gate 22. The first inverter 18 receives the PDL* signal from the helper flip-flop 12. The output of first inverter 18 is input to both NAND gate 20 and NOR gate 22. The EN signal is input to NAND gate 20 and input to third inverter 24. The output of third inverter 24 is input to NOR gate 22. The output of NAND gate 20 is signal P2 and the output of NOR gate 22 is signal P3. The second inverter 19 is used to balance the load of the PDL signal against the load seen by the PDL* signal for more accurate sensing.

The output driver circuit 16 comprises two transistors Q8 and Q9. The output driver circuit 16 receives its input from the transition logic circuit 14. The output from NAND gate 20 is coupled to the gate of transistor Q8 of the output driver circuit 16, and the output of NOR gate 22 is coupled to the gate of a transistor Q9 of output driver circuit 16. When EN is low, output signal PD is at a high impedance state because transistors Q8 and Q9 are off.

Figure 3:
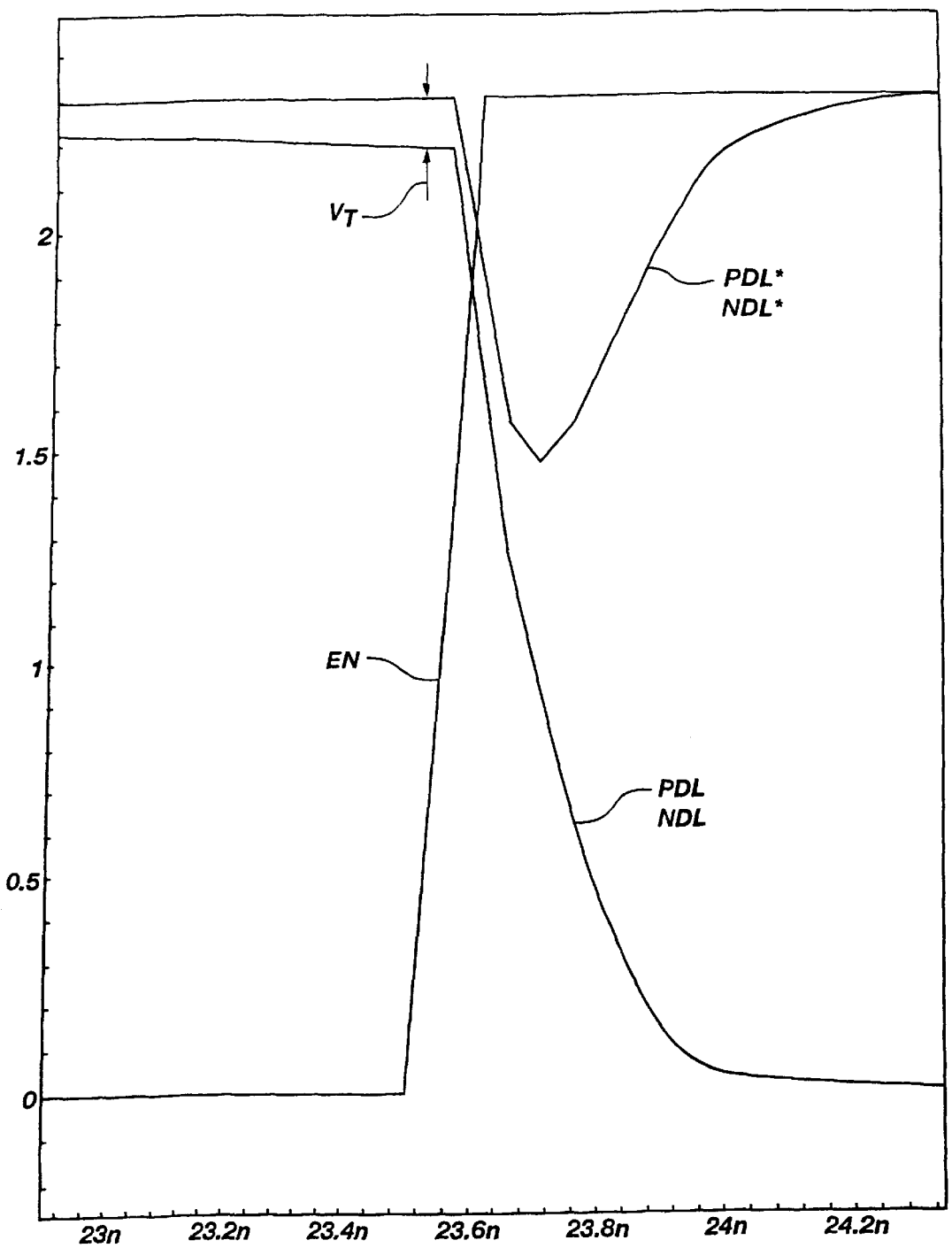
FIG. 3 is a timing diagram of latched complementary data signals as an enable signal goes active for the circuits illustrated in FIGS. 1 and 2.

Refer additionally to FIG. 3 during the following explanation of the operation of the helper flip-flop 12. Initially, the EN signal is low, signals DI, DI*, PDL and PDL* are all biased high and transistors Q8 and Q9 are off. Because PDL* is high, P1 is low. Data from a memory cell is then passed onto the DI and DI* lines-in the form of a weak differential voltage. Suppose further that this weak differential voltage is a high on signal PDL*. Once this weak differential voltage is sufficient, ie., it passes a threshold voltage, $V_T$, the EN signal goes high. When the EN line is driven high, transistors Q1 and Q3 of the helper flip-flop 12 turn off, thereby isolating the PDL and PDL* lines from the large capacitance loading of the DI and DI* lines. The EN signal going high also turns on the pull down transistor Q7, causing lines PDL and PDL* to separate, ie., PDL* goes high and PDL goes low. Note that FIG. 3 is also illustrative of the operation of helper flip-flop 12 where signals PDL and PDL* are reversed since they are complementary signals.

Figure 4:
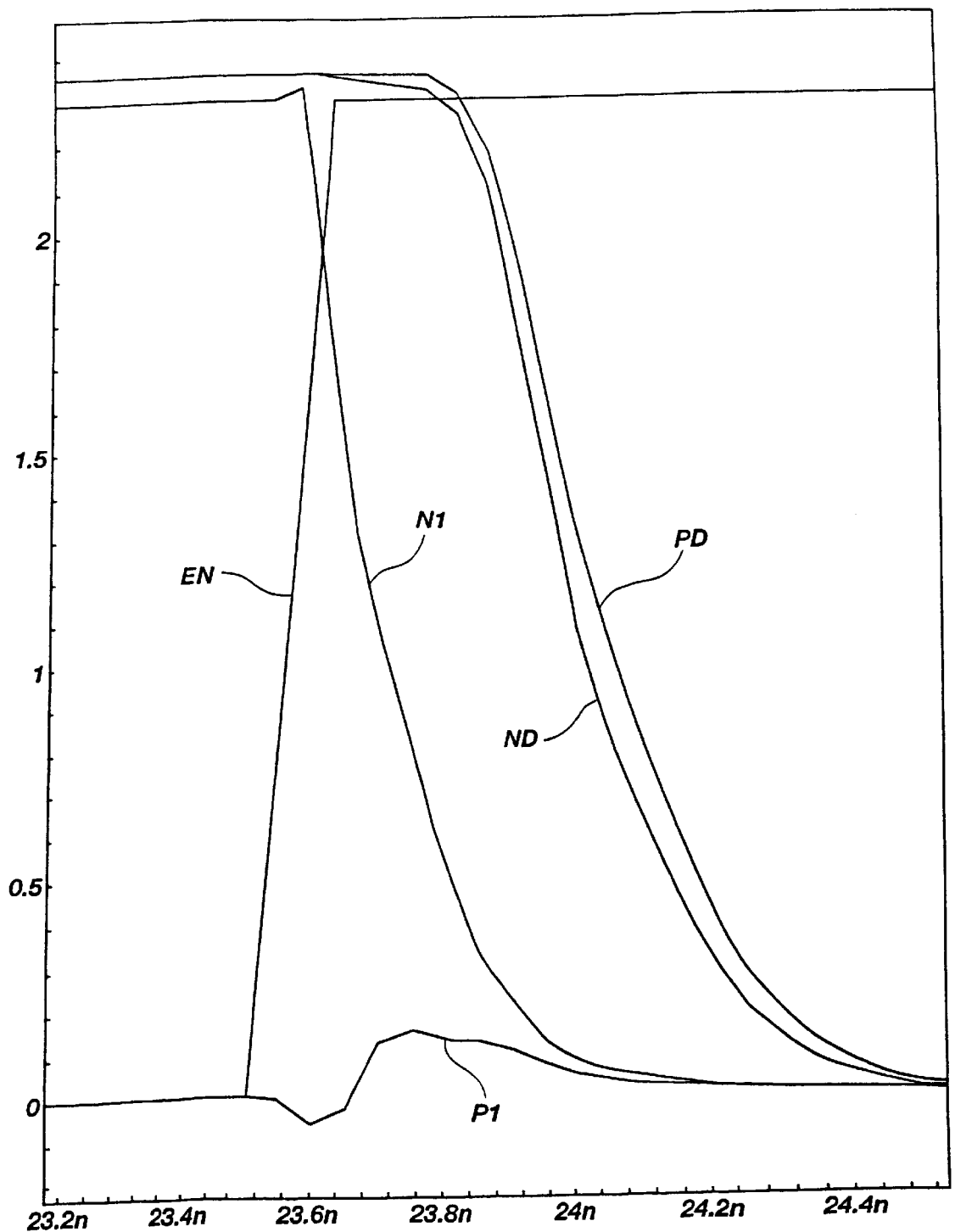
FIG. 4 is a timing diagram of the response time of both circuits in FIGS. 1 and 2 when the data is sensed low.

Referring now to FIG. 4, the operation of transition logic circuit 14 and output driver circuit 16 are explained. In the case that PDL* goes high on separation, ie., PDL* is sensed high, P1 stays low. With P1 low and EN high, the output, P2, of NAND gate 20 goes high. With the EN signal high, the output of the third inverter 24 goes low, and then P3 goes high. Since P2 and P3 are high, transistor Q8 is off and transistor Q9 is on, pulling output signal PD low.

Because lines DI, DI*, PDL and PDL* are biased high, sensing a high signal is much faster than sensing a low signal. In the case where PDL* is sensed high, the EN signal is a limiting factor in the speed of the transition logic circuit 14 which enables output driver circuit 16 because P1, the output of first inverter 18, stays low.

Figure 5:
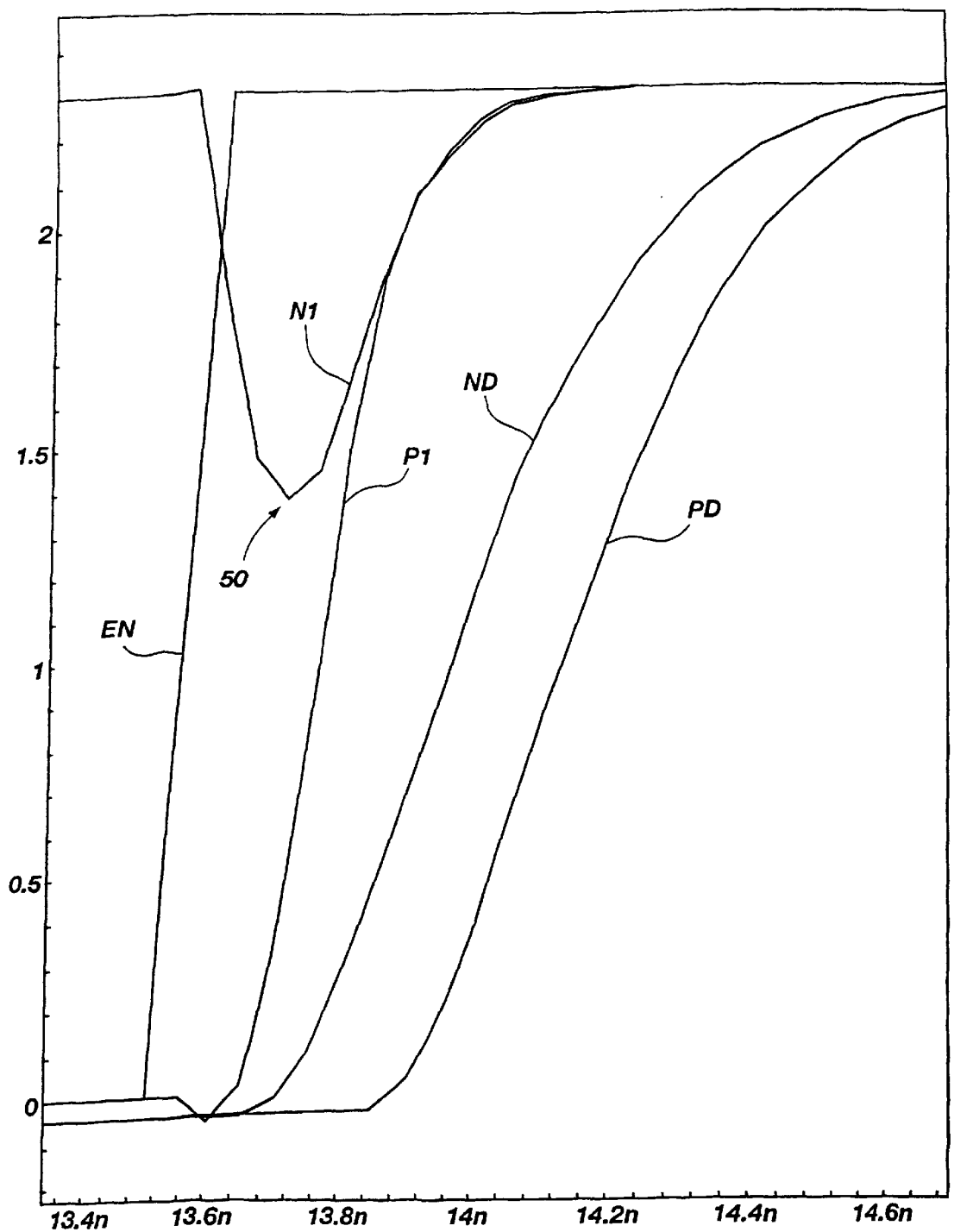
FIG. 5 is a timing diagram of the response time of both circuits in FIGS. 1 and 2 when the data is sensed high.

Referring to FIGS. 1 and 5, the case where PDL* line is sensed low will now be explained. Initially, the EN signal is low, signals DI, DI*, PDL and PDL* are all biased high and transistors Q8 and Q9 are off. Because PDL* is initially biased high, P1 is low, P2 is high, P3 is low and PD is low. When PDL* is sensed low, P1 goes high. With P1 high and the EN signal high, the output P2 of NAND gate 20 goes low, thus turning transistor Q8 on. With P1 having transitioned high and the output of third inverter 24 low, the output P3 of NOR gate 22 remains low, leaving transistor Q9 off. With transistor Q8 on and transistor Q9 off, the output signal PD is pulled high. Because P1 swings from low (0 volts) to high (2.3 volts), ie., rail to rail, after a small voltage difference is sensed by helper flip-flop 12 to trigger transitions in the NAND gate 20 and the NOR gate 22, the output signal DP going high switches slower than in the case when the EN signal causes output signal PD to go low.

Figure 2:
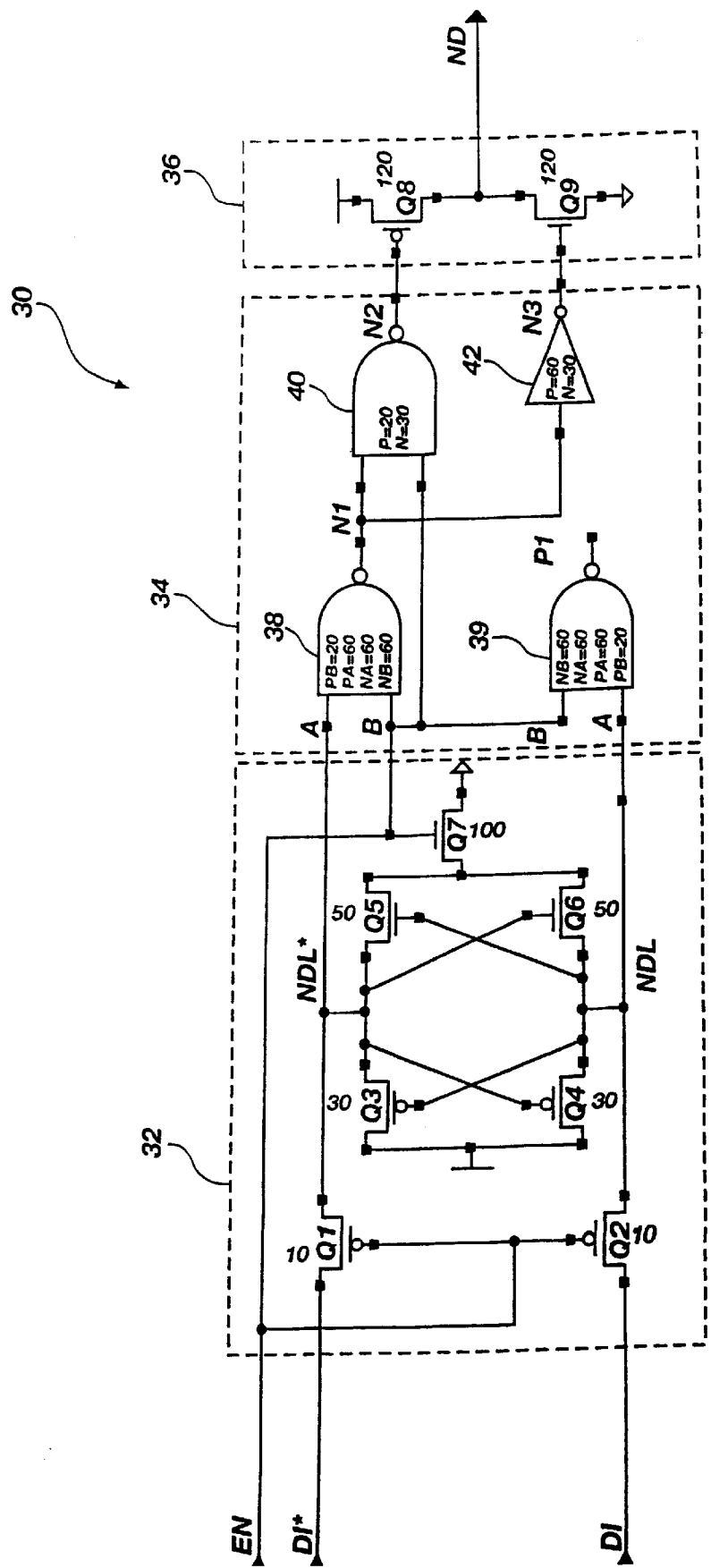
FIG. 2 is a schematic diagram of a sensing circuit according to the present invention.

Referring now to FIG. 2, a schematic diagram of a sensing circuit 30 is shown according to the present invention. The sensing circuit 30 is suitable for use in a memory array (not shown). The sensing circuit 30 includes a helper flip-flop 32 coupled to a transition logic circuit 34 which in turn is coupled to an output driver circuit 36. Helper flip-flop 32 is the same as helper flip-flop 12 shown in FIG. 1. Thus, FIG. 3 and the discussion for helper flip-flop 12 above are illustrative of the operation of helper flip-flop 32. Similarly, output driver circuit 36 is the same as output driver circuit 16 as shown in FIG. 1. The output driver circuit 36 provides output signal ND.

The transition logic circuit 34 in FIG. 2 includes a first NAND gate 38, a second NAND gate 39, a third NAND gate 40 and an inverter 42. First NAND gate 38 outputs signal N1 based on inputs NDL* and EN. Third NAND gate 40 outputs signal N2 based on inputs N1 and EN. Second NAND gate 39 is used to balance the load of the NDL signal versus the load seen by the NDL* signal for more accurate sensing. Inverter 42 inverts signal N1 to produce signal N3.

Referring to FIGS. 2 and 4, the operation of transition logic circuit 34 and output driver circuit 36 with respect to sensing a high on signal NDL* is explained. Initially, EN is low and signals DI, DI*, NDL and NDL* are all biased high. Thus initially, N1 is high, N2 is high, N3 is low and transistors Q8 and Q9 are off. When the EN signal transitions high, the output N1 of first NAND gate 38 goes low. If signal NDL* were sensed low, signal N1 would remain low. A low on signal N1 causes N2 to remain high and N3 to go high, leaving transistor Q8 off and turning on transistor Q9, and finally pulling output signal ND low. Because inverter 42 is slightly faster than NOR gate 22, the output ND of the inventive sensing circuit 30 occurs ahead of the output PD of the prior art sensing circuit 10. The EN signal is the limiting factor for sensing high with both circuits (30 and 10).

Referring now to FIGS. 2 and 5, the operation of transition logic circuit 34 and output driver circuit 36 with respect to sensing a low on signal NDL* is explained. Initially, the EN signal is low and signals DI, DI*, NDL and NDL* are all biased high. Consequently, N1 is high, N2 is high, N3 is low, transistors Q8 and Q9 are both off and the output driver circuit 36 is a high impedance to signal ND. As the EN signal transitions high, N1 begins to transition low. If NDL* is then sensed low, N1 transitions back up to a high from a midpoint 50. With N1 high, N2 goes low and N3 remains low. Thus, transistor Q8 turns on, pulling ND high, and transistor Q9 remains off: If signal NDL* had been sensed high rather than sensed low, N1 would continue from the midpoint 50 down to a low. FIG. 5 shows that the output signal ND drives high considerably faster than the PD signal of the prior art sensing circuit 10. The faster response time of the inventive sensing circuit 30 is due to driving N1 from a midpoint 50 rather than from rail to rail, i.e., from 0 to 2.3 volts.

In essence, the transition logic circuit 34 of FIG. 2 gives the NAND gate 38 a head start by allowing it to start at midpoint 50 during the sense time rather than having to drive from rail to rail as is required in the transition logic circuit 14 of FIG. 1. The transition logic circuit 34 of FIG. 2 improves output response time of ND by approximately 0.2 nanoseconds from that of output signal PD. This gives transition logic circuit 34 a 20–25% improvement over the speed of the prior art system in the worst case. Further, the worst case scenario in the present invention is now much closer to the best case. As the best case and worst case are more evenly matched in the improved sensing circuit 30 and since the memory speed is dependent upon the worst case, the transition logic circuit 34 provides a significant improvement in speed over the prior art transition logic circuit 14.

Accordingly, transition logic circuit 34 utilizes the inherent delay between when the EN signal drives high and when data is valid to pull the transition logic circuit 34 to a midpoint 50. Since this intermediate timing signal N1 starts at midpoint, the swing to valid data becomes faster than was previously possible since the signal N1 no longer needs to swing from rail to rail as was required in the prior art.

Those skilled in the art will appreciate that semiconductor devices according to the present invention may comprise an integrated circuit die employed for storing or processing digital information, including, for example, a Dynamic Random Access Memory (DRAM) integrated circuit die, a Static Random Access Memory (SRAM) integrated circuit die, a Synchronous Graphics Random Access Memory (SGRAM) integrated circuit die, a Programmable Read-Only Memory (PROM) integrated circuit die, an Electrically Erasable PROM (EEPROM) integrated circuit die, a flash memory die and a microprocessor die, and that the present invention includes such devices within its scope. An example of such a memory array is shown in U.S. Pat. No. 5,325,330, herein incorporated by reference for all purposes.

Figure 6:
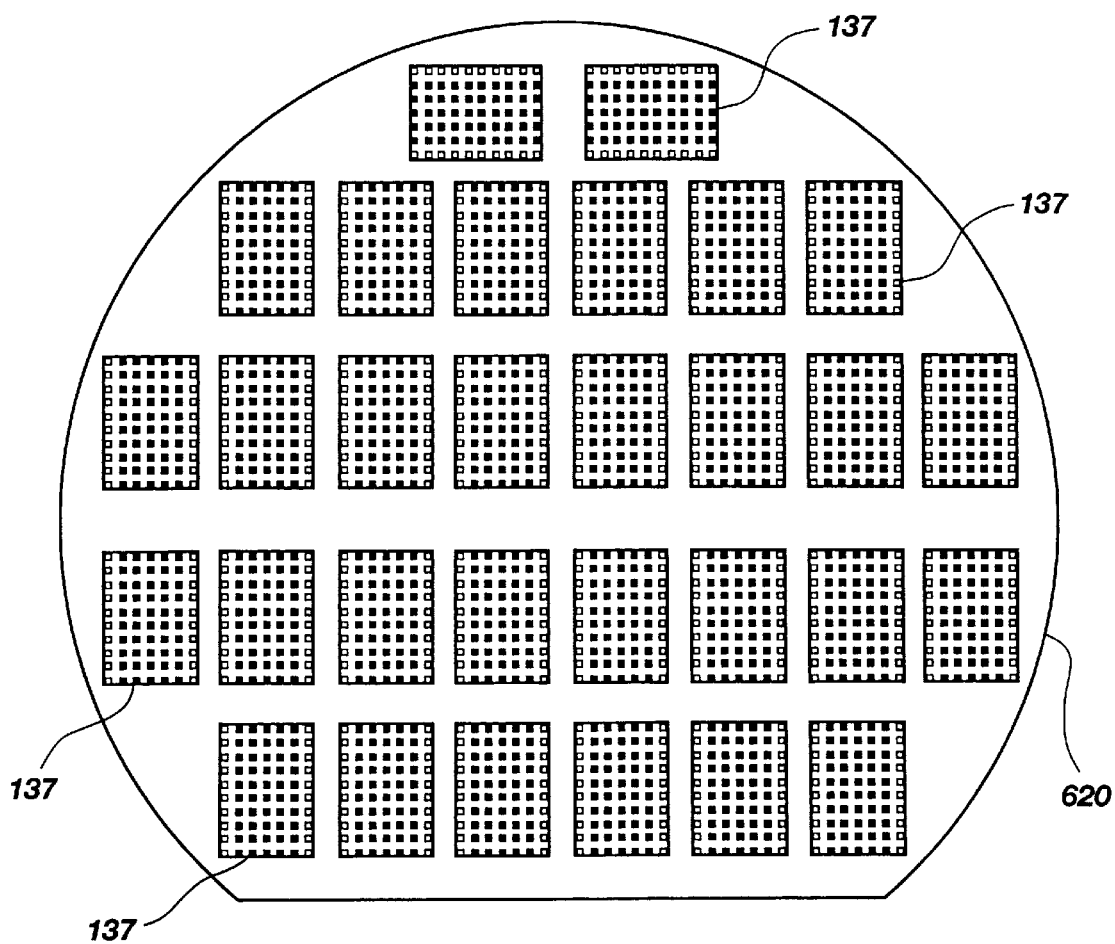
FIG. 6 is a top view of a semiconductor wafer comprising a plurality of the semiconductor devices incorporating the sensing circuit illustrated in FIG. 2.

As shown in FIG. 6, a semiconductor wafer 620 incorporates a plurality of integrated memory device 137 (shown in increased scale and reduced numbers relative to the wafer 620), each of which includes a memory array (not shown) incorporating the sensing circuit 30 of FIG. 2.

Figure 7:
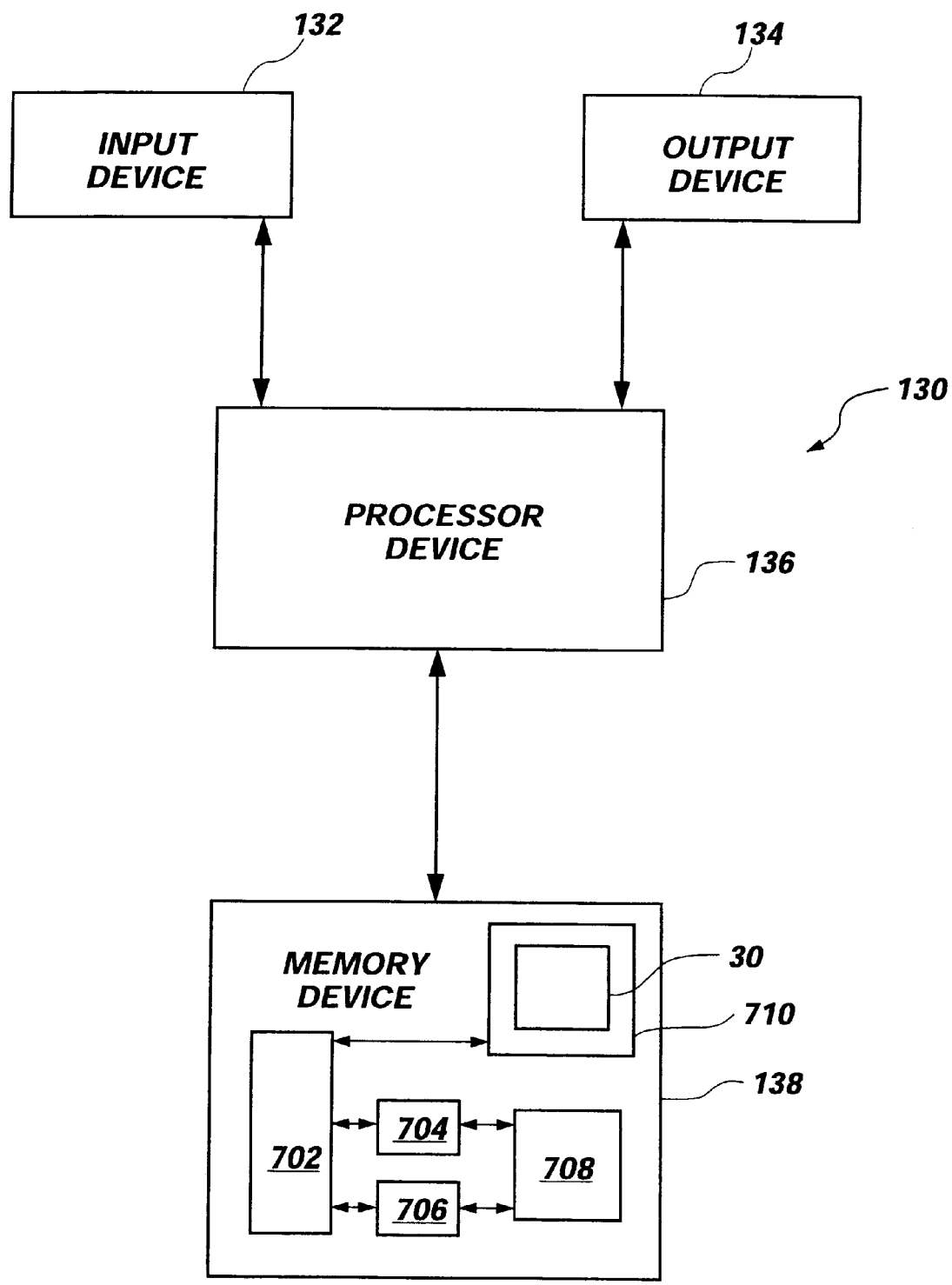
FIG. 7 is a block diagram of an electronic system incorporating a semiconductor device incorporating the sensing circuit of FIG. 2.

FIG. 7 illustrates a block diagram of an electronic system 130, such as a computer, including an input device 132 and an output device 134 coupled to a processor device 136, which, in turn, is coupled to a memory device 138 incorporating the exemplary sensing circuit 30 of FIG. 2. Memory device 138 includes a read/write controller 702, a row decoder 704 coupled to the read/write controller 702, a column decoder 706 coupled to the read/write controller 702, a memory array 708 coupled to the row decoder 704 and the column decoder 706, and a sense amplifier 710 coupled to the read/write controller 702 and the memory array 708. Sense amplifier 710 includes sensing circuit 30 as described herein.

Accordingly, the claims appended hereto are written to encompass all semiconductor devices including those mentioned. Those skilled in the art will also appreciate that various combinations and obvious modifications of the preferred embodiments may be made without departing from the spirit of this invention and the scope of the accompanying claims.

What is claimed is:

1. A random access memory circuit comprising:
    a read/write controller;
    a row decoder coupled to said read/write controller;
    a column decoder coupled to said read/write controller;
    a memory array coupled to said row decoder and said column decoder; and
    a sense amplifier coupled to said read/write controller and said memory array, comprising:
        a sensing circuit comprising:
            a pair of complementary data signal lines;
            an enable line for receiving an enable signal from said read/write controller;
            a helper flip-flop coupled to said pair of complementary data signal lines and said enable line;
            a transition logic circuit coupled to said helper flip-flop and said enable line comprising:
                a first NAND gate having a first input from said enable line and a second input from a latched data signal for outputting a first timing signal;
                a second NAND gate having a first input from said enable line and a second input from a latched complementary data signal for balancing said transition logic circuit;
                a third NAND gate having a first input from said enable line and a second input from said first timing signal for outputting a second timing signal; and
                an inverter for receiving said first timing signal and outputting a third timing signal; and
        a data driver circuit coupled to said transition logic circuit for outputting a signal analogous to a signal presented on said pair of complementary data signal lines.

2. The random access memory circuit according to claim 1, wherein said data driver circuit comprises:
    a PMOS transistor having a gate coupled to said second timing signal; and
    an NMOS transistor coupled to said PMOS transistor and having a gate coupled to said third timing signal.

3. The random access memory circuit according to claim 2, wherein said PMOS transistor comprises a pull up transistor and wherein said NMOS transistor comprises a pull down transistor.

4. A semiconductor chip on which is fabricated a random access memory circuit comprising:
    a read/write controller;
    a row decoder coupled to said read/write controller;
    a column decoder coupled to said read/write controller;
    a memory array coupled to said row decoder and said column decoder; and
    a sense amplifier coupled to said read/write controller and said memory array comprising:

a sensing circuit comprising:
  a pair of complementary data signal lines;
  an enable line for receiving an activating enable signal from said read/write controller;
  a helper flip-flop coupled to said pair of complementary data signal lines and said enable line;
  a transition logic circuit coupled to said helper flip-flop and said enable line, comprising:
    a first NAND gate having a first input from said enable line and a second input from a latched data signal for outputting a first timing signal;
    a second NAND gate having a first input from said enable line and a second input from a latched complementary data signal for balancing said transition logic circuit;
    a third NAND gate having a first input from said enable line and a second input from said first timing signal for outputting a second timing signal; and
    an inverter receiving said first timing signal and outputting a third timing signal; and
  a data driver circuit coupled to said transition logic circuit for outputting a signal analogous to a signal presented on said pair of complementary data signal lines.

5. The semiconductor chip according to claim 4, wherein said data driver circuit comprises:
  a PMOS transistor with a gate coupled to said second timing signal; and
  an NMOS transistor coupled to said PMOS transistor and with a gate coupled to said third timing signal.

6. The semiconductor chip according to claim 5, wherein said PMOS transistor comprises a pull up transistor and said NMOS transistor comprises a pull down transistor.

7. A computer system comprising:
  a processor;
  an input device coupled to said processor;
  an output device coupled to said processor; and
  a memory device coupled to said processor comprising:
    a read/write controller;
    a row decoder coupled to said read/write controller;
    a column decoder coupled to said read/write controller;
    a memory array coupled to said row decoder and said column decoder; and
    a sense amplifier coupled to said read/write controller and said memory array comprising:
      a sensing circuit comprising:
        a pair of complementary data signal lines;
        an enable line for receiving an activating enable signal from said read/write controller;
        a helper flip-flop coupled to said pair of complementary data signal lines and said enable line;
        a transition logic circuit coupled to said helper flip-flop and said enable line, comprising:
          a first NAND gate having a first input from said enable line and a second input from a latched data signal for outputting a first timing signal;
          a second NAND gate having a first input from said enable line and a second input from a latched complementary data signal for balancing said transition logic circuit;
          a third NAND gate having a first input from said enable line and a second input from said first timing signal for outputting a second timing signal; and
          an inverter for receiving said first timing signal and outputting a third timing signal; and
        a data driver circuit coupled to said transition logic circuit for outputting a signal analogous to a signal presented on said pair of complementary data signal lines.

8. The computer system according to claim 7, wherein said data driver circuit comprises:
  a PMOS transistor with a gate coupled to said second timing signal; and
  an NMOS transistor coupled to said PMOS transistor and with a gate coupled to said third timing signal.

9. The computer system according to claim 8, wherein said PMOS transistor comprises a pull up transistor and said NMOS transistor comprises a pull down transistor.

10. A semiconductor wafer comprising:
  a semiconductor wafer; and
  a plurality of memory devices fabricated on said semiconductor wafer, wherein each of said memory devices comprises:
    a read/write controller;
    a row decoder coupled to said read/write controller;
    a column decoder coupled to said read/write controller;
    a memory array coupled to said row decoder and said column decoder; and
    a sense amplifier coupled to said read/write controller and said memory array comprising:
      a sensing circuit comprising:
        a pair of complementary data signal lines;
        an enable line for receiving an activating enable signal from said read/write controller;
        a helper flip-flop coupled to said pair of complementary data signal lines and said enable line;
        a transition logic circuit coupled to said helper flip-flop and said enable line, comprising:
          a first NAND gate having a first input from said enable line and a second input from a latched data signal for outputting a first timing signal;
          a second NAND gate having a first input from said enable line and a second input from a latched complementary data signal for balancing said transition logic circuit;
          a third NAND gate having a first input from said enable line and a second input from said first timing signal for outputting a second timing signal; and
          an inverter for receiving said first timing signal and outputting a third timing signal; and
        a data driver circuit coupled to said transition logic circuit for outputting a signal analogous to a signal presented on said pair of complementary data signal lines.

11. The semiconductor wafer of claim 10, wherein said data driver circuit comprises:
  a PMOS transistor with a gate coupled to said second timing signal; and
  an NMOS transistor coupled to said PMOS transistor and with a gate coupled to said third timing signal.

12. A memory module comprising:
  a substrate for mounting integrated circuits; and
  a plurality of memory devices each configured as an integrated circuit and mounted to said substrate, each of said plurality of memory devices comprising:
    a read/write controller;
    a row decoder coupled to said read/write controller;

a column decoder coupled to said read/write controller;
a memory array coupled to said row decoder and said column decoder; and
a sense amplifier coupled to said read/write controller and said memory array comprising:
    a sensing circuit comprising:
        a pair of complementary data signal lines;
        an enable line for receiving an activating enable signal from said read/write controller;
        a helper flip-flop coupled to said pair of complementary data signal lines and said enable line;
        a transition logic circuit coupled to said helper flip-flop and said enable line, comprising:
            a first NAND gate having a first input from said enable line and a second input from a latched data signal for outputting a first timing signal;
            a second NAND gate having a first input from said enable line and a second input from a latched complementary data signal for balancing said transition logic circuit;
            a third NAND gate having a first input from said enable line and a second input from said first timing signal for outputting a second timing signal; and
            an inverter for receiving said first timing signal and outputting a third timing signal; and
        a data driver circuit coupled to said transition logic circuit for outputting a signal analogous to a signal presented on said pair of complementary data signal lines.

13. The memory module of claim 12, wherein said data driver circuit comprises:
    a PMOS transistor with a gate coupled to said second timing signal; and
    an NMOS transistor coupled to said PMOS transistor and with a gate coupled to said third timing signal.

14. The memory module of claim 12, wherein each of said plurality of memory device is a Dynamic Random Access Memory (DRAM).

15. The memory module of claim 12, wherein each of said plurality of memory device is a Synchronous Graphics Random Access Memory (SGRAM).

16. The memory module of claim 12, wherein each of said plurality of memory device is a Static Random Access Memory (SRAM).

* * * * *

UNITED STATES PATENT AND TRADEMARK OFFICE
CERTIFICATE OF CORRECTION

PATENT NO. : 6,385,108 B2
DATED : May 7, 2002
INVENTOR(S) : Christopher K. Morzano It is certified that error appears in the above-identified patent and that said Letters Patent is hereby corrected as shown below:

Column 1,
Line 47, insert a period after "data"

Column 2,
Line 45, at the beginning of the line, change "enable" to -- enabled --

Column 3,
Line 53, change "lines-in" to -- lines in --

Column 4,
Line 1, change "ie.," to -- i.e., --
Line 22, insert a period after "off"
Line 25, change "ie.," to -- i.e., --

Column 5,
Line 4, insert a comma after "off"
Line 10, change the colon after "off" to a period
Line 35, after "the" and before "transition" insert -- output N1 of NAND gate 38 of the --
Line 55, change "device" to -- devices --

Column 8,
Line 19, after "said" and before "memory" insert -- plurality of --

Column 10,
Lines 14, 17 and 20, change "device" to -- devices --

Signed and Sealed this

Twenty-second Day of March, 2005

JON W. DUDAS
*Director of the United States Patent and Trademark Office*